United States Patent [19]

Hardin et al.

[11] Patent Number: 5,691,925
[45] Date of Patent: Nov. 25, 1997

[54] DERIVING TRACTABLE SUB-SYSTEM FOR MODEL OF LARGER SYSTEM

[75] Inventors: Ronald H. Hardin, Pataskala, Ohio; Robert P. Kurshan, New York, N.Y.

[73] Assignee: Lucent Technologies Inc., Murray Hill, N.J.

[21] Appl. No.: 383,341

[22] Filed: Feb. 3, 1995

Related U.S. Application Data

[63] Continuation-in-part of Ser. No. 906,082, Jun. 29, 1992, Pat. No. 5,483,470.
[51] Int. Cl.⁶ .................................................. G06F 17/00
[52] U.S. Cl. ............................................................ 364/578
[58] Field of Search ........................... 364/578, 5, 4, 364/2, 232.3, 281.6, 933.8, 488, 489, 512, 553; 395/500, 919, 920, 921, 922, 66, 67

[56] References Cited

U.S. PATENT DOCUMENTS 5,163,016  11/1992  Har'El et al. ............................ 364/578
5,483,470  1/1996  Alur et al. ............................... 364/578

*Primary Examiner*—Ellis B. Ramirez

[57] ABSTRACT

The invention concerns reduction of a complex model of a system to a simpler model. The invention defines a task postulates a simple sub-system, and inquires whether the sub-system achieves the task. If not, the invention selects components from the complex model, based on functional relationship of the components to the task, adds the components to the simpler sub-system, and again inquires whether the sub-system achieves the task. The addition process is repeated until a sub-system is attained which does achieve the task.

3 Claims, 19 Drawing Sheets

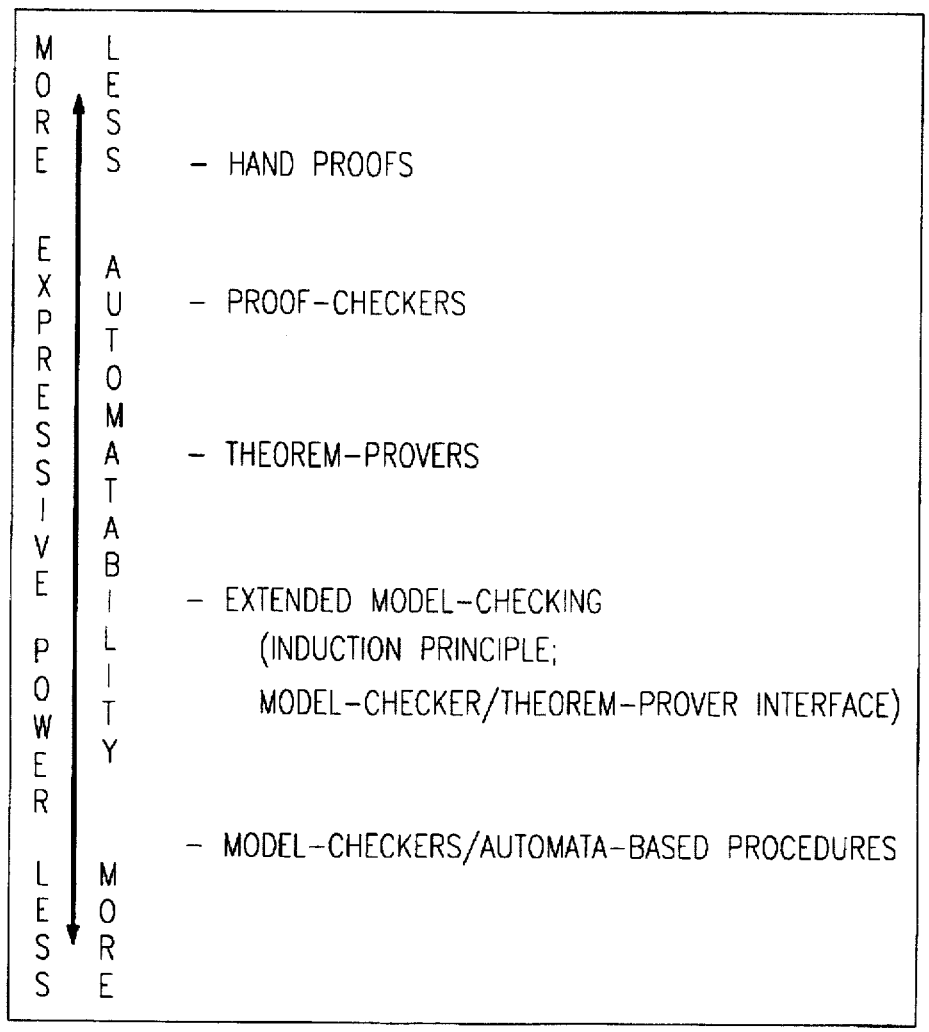
FIG. 1.1
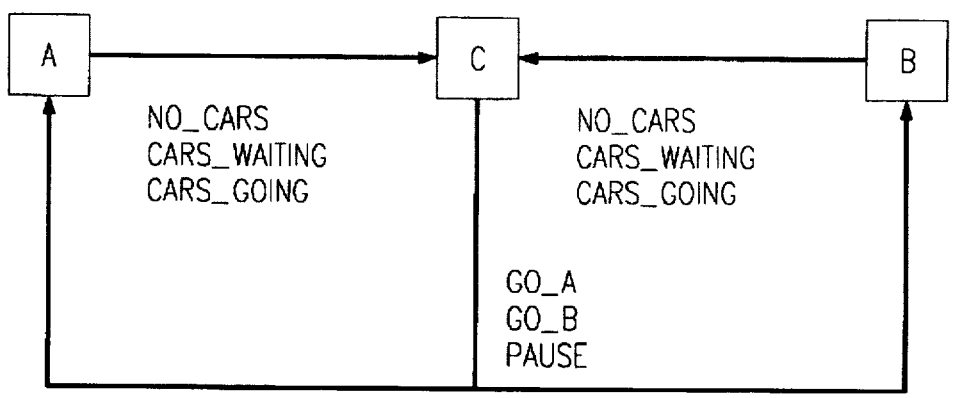
FIG. 1.2

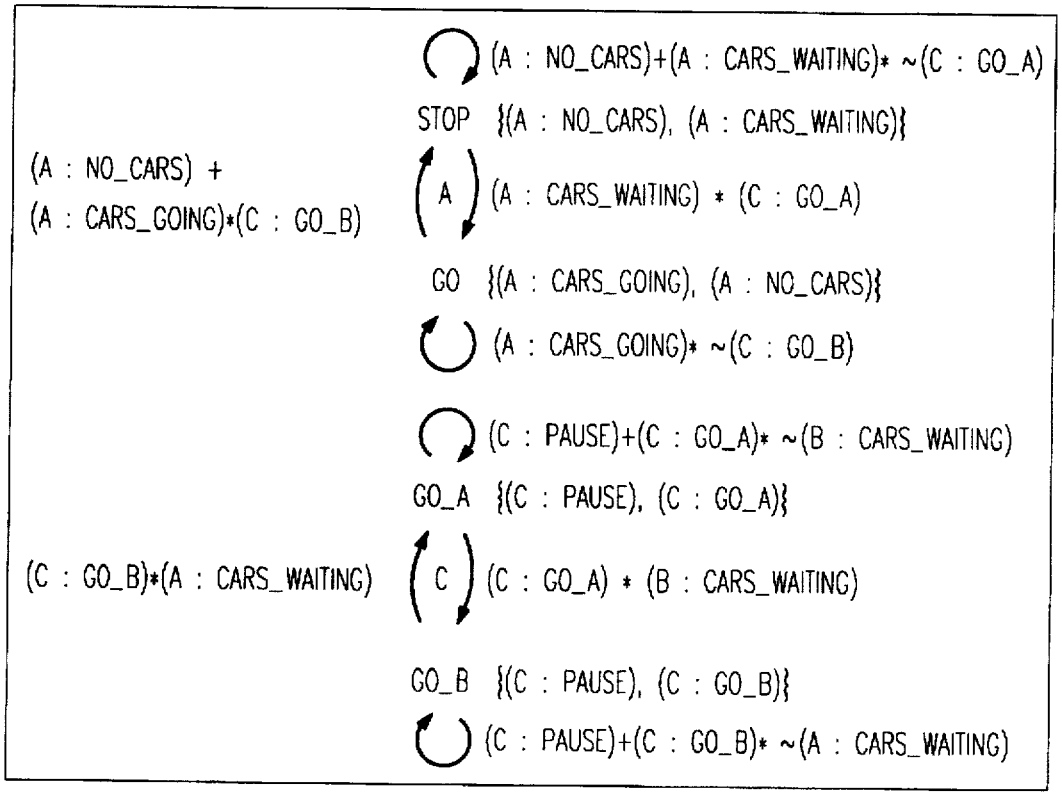
FIG. 1.3
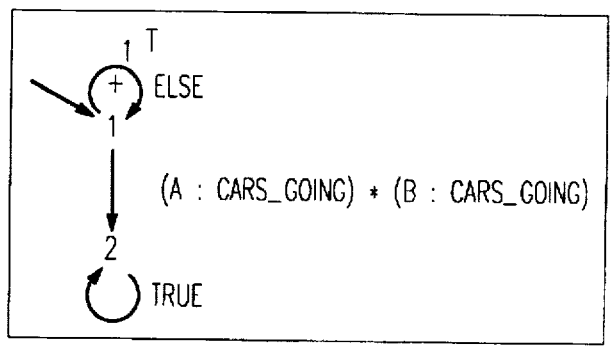
FIG. 1.4
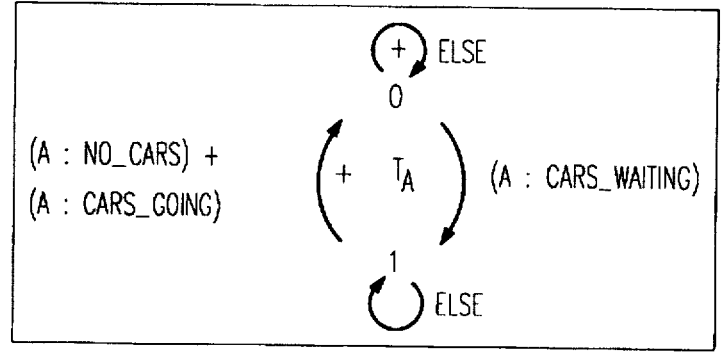
FIG. 1.5

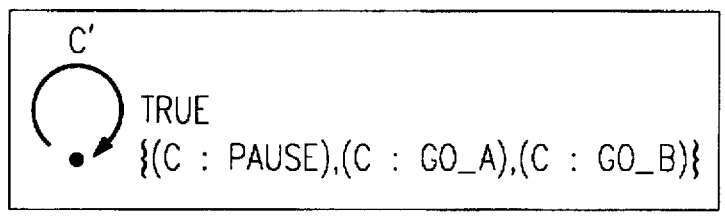
*FIG. 1.5A*
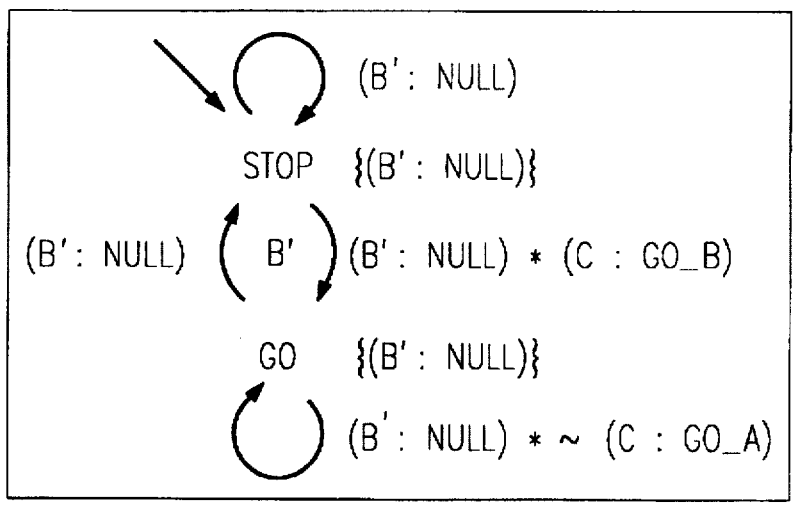
*FIG. 1.5B*
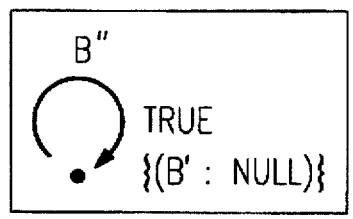
*FIG. 1.5C*

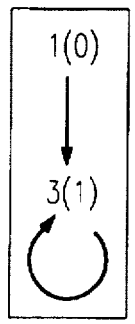
*FIG. 1.5D*
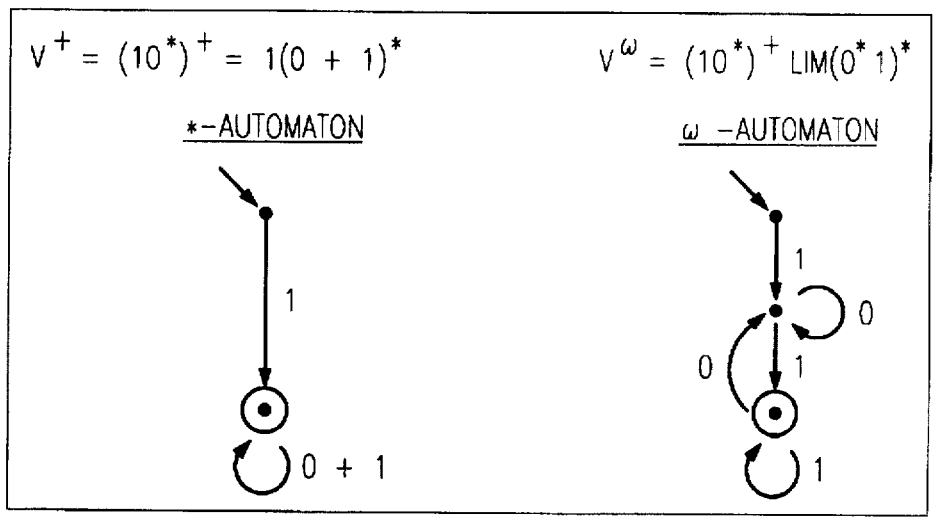
*FIG. 1.5E*
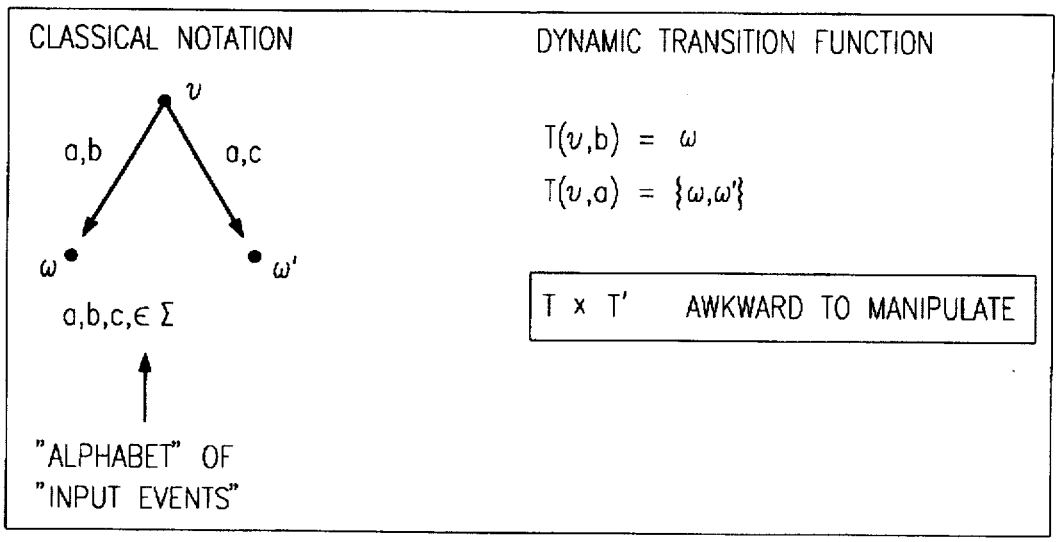
*FIG. 2.1*

FIG. 2.1A  $(x_1=1) \equiv (1,0,0),(1,0,1),(1,1,0),(1,1,1)$
FIG. 2.2  $(x_1=1) + (x_2=1) * (x_3=1) = M(v,\omega)$
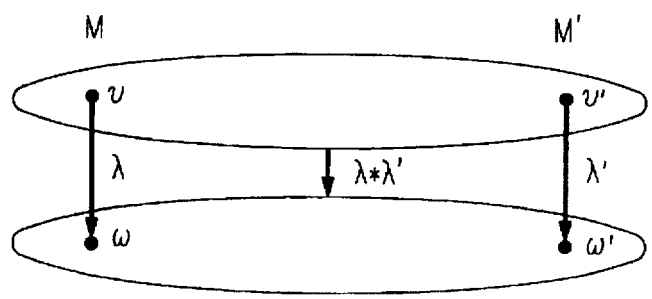
FIG. 2.3

$$\begin{array}{c} M \\ v_1 \cdots v_j \cdots v_n \end{array}$$
$$\begin{array}{c} v_1 \\ \vdots \\ v_i \\ \vdots \\ v_n \end{array} \left( \begin{array}{c} \lambda_{ij} \end{array} \right) \quad \lambda_{ij} = M(v_i, v_j)$$
↑
STATES
*FIG. 2.4*
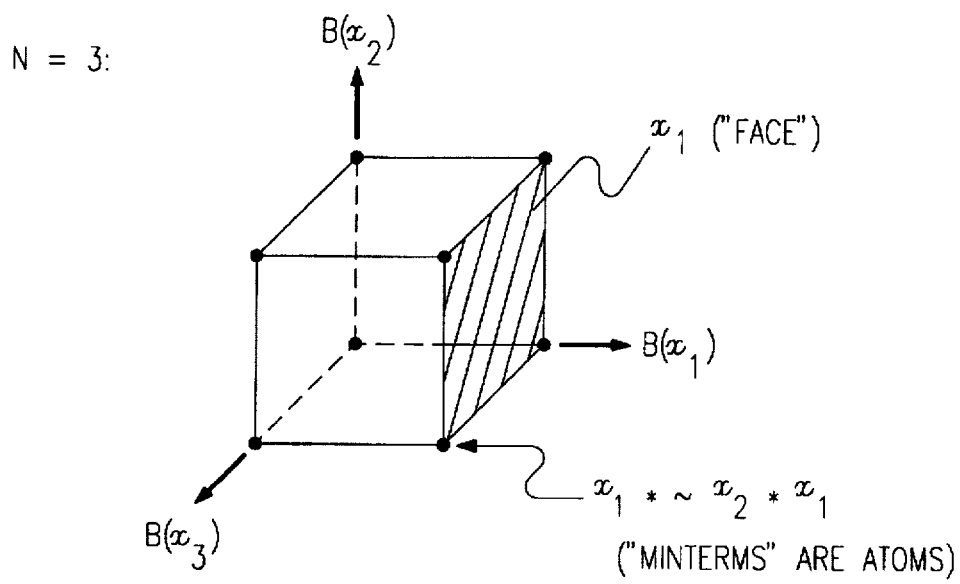
*FIG. 2.5*
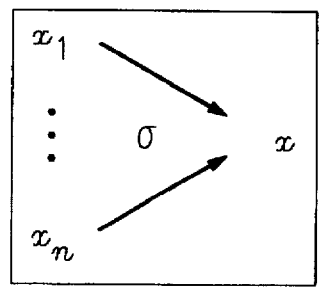
*FIG. 4.1A*

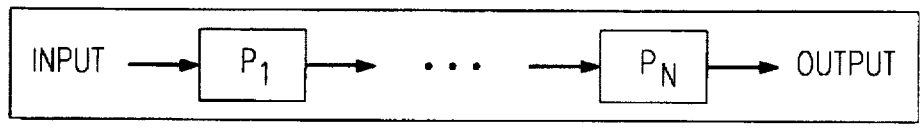
*FIG. 5.1*
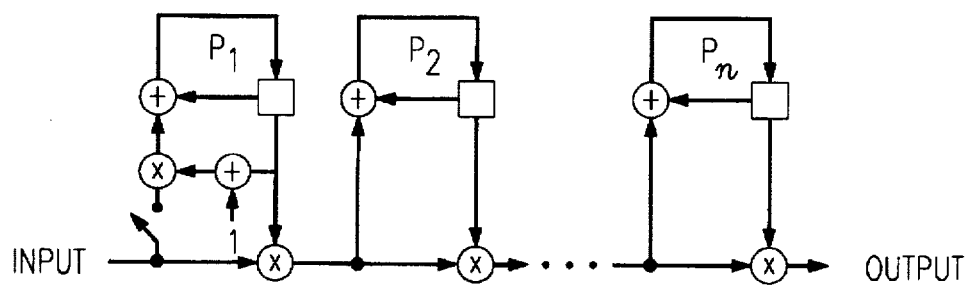
*FIG. 5.2*
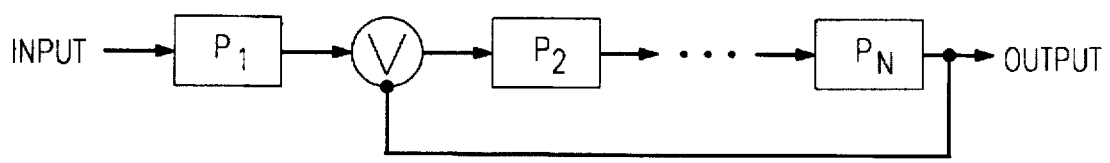
*FIG. 5.3*

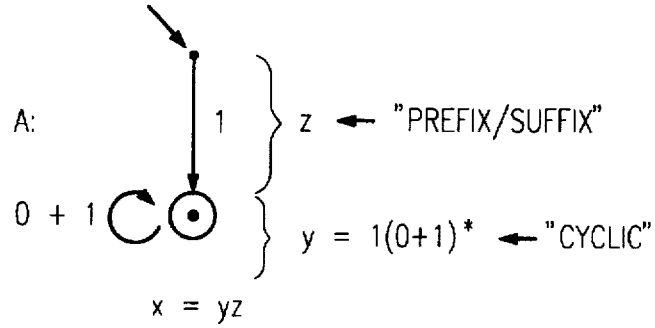
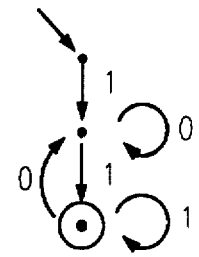
FIG. 6.1A
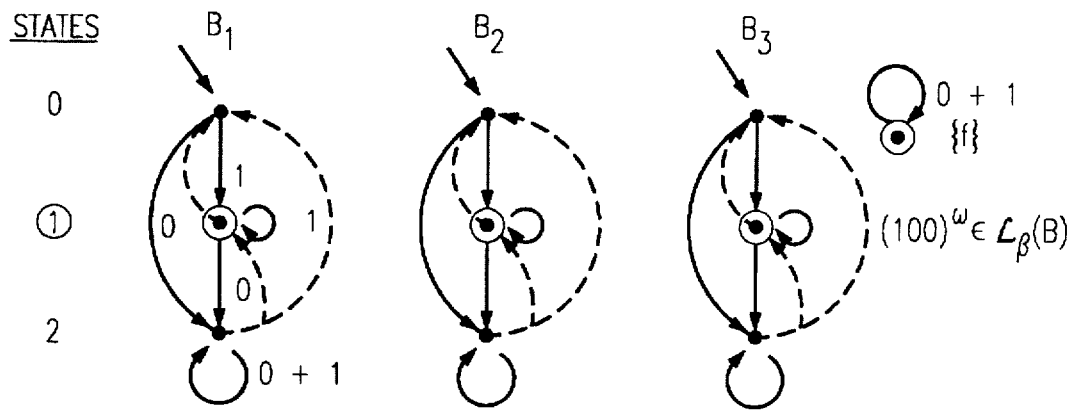
FIG. 6.1B
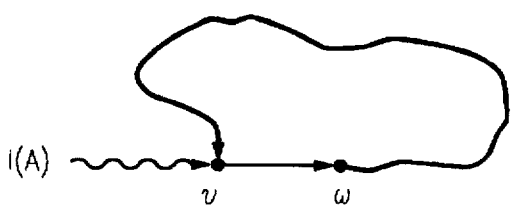
FIG. 6.1C

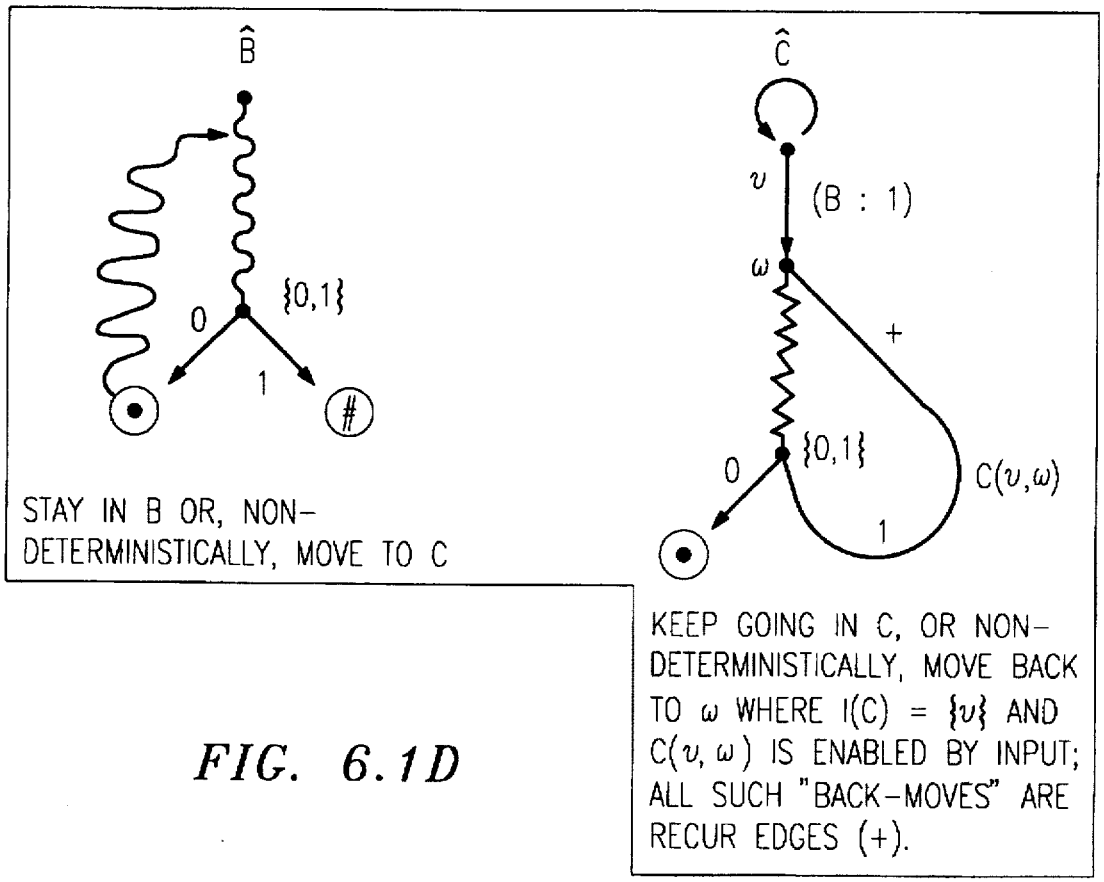
FIG. 6.1D
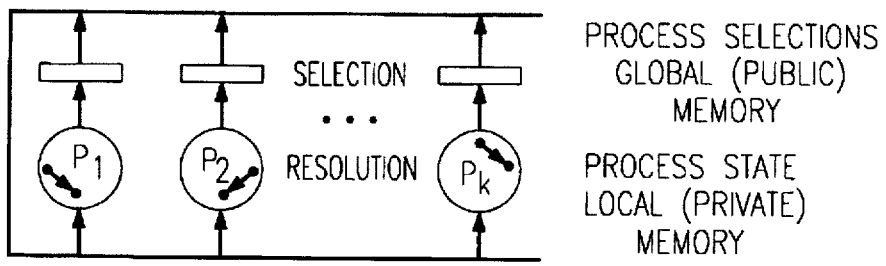
FIG. 7.1

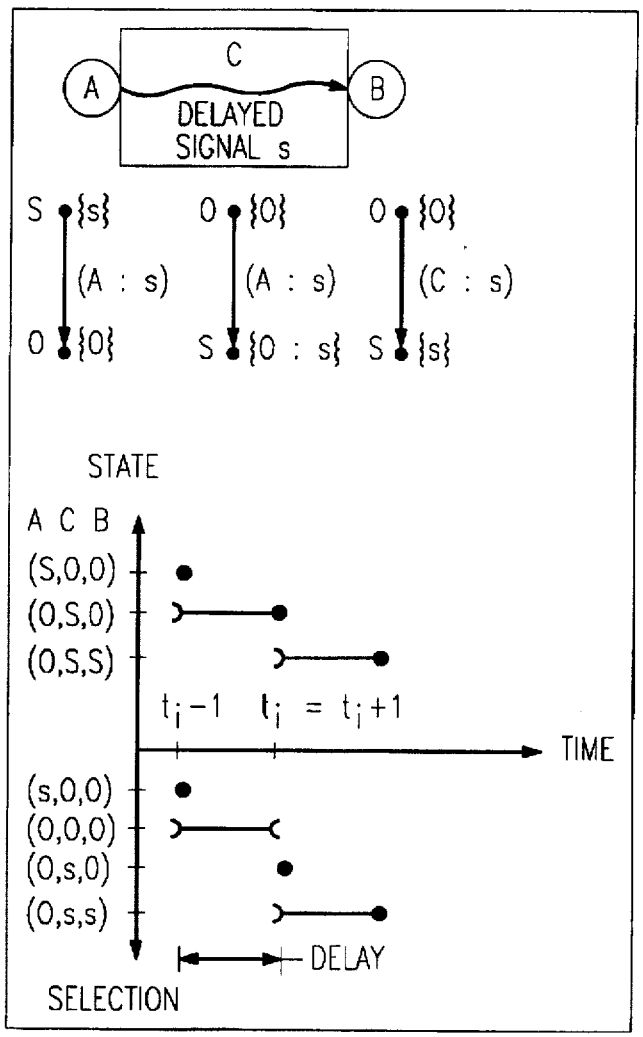
FIG. 7.2
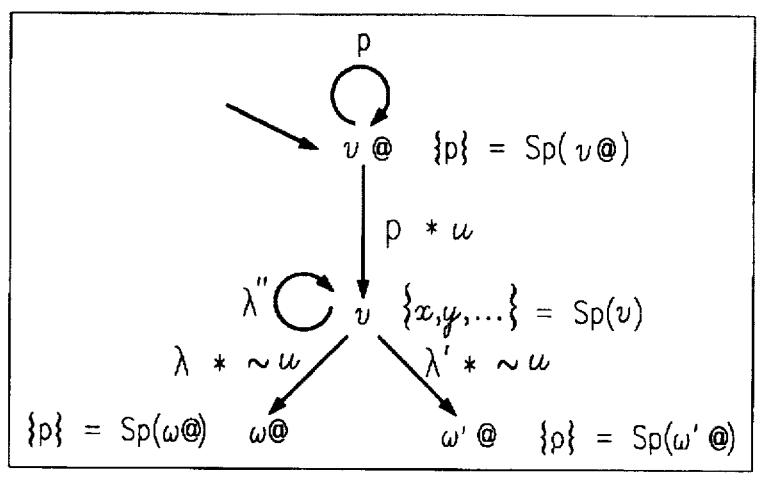
FIG. 7.3

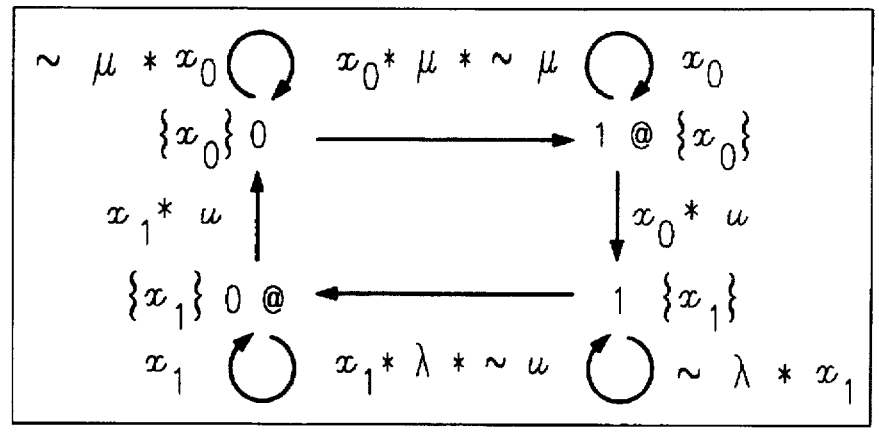
FIG. 7.4
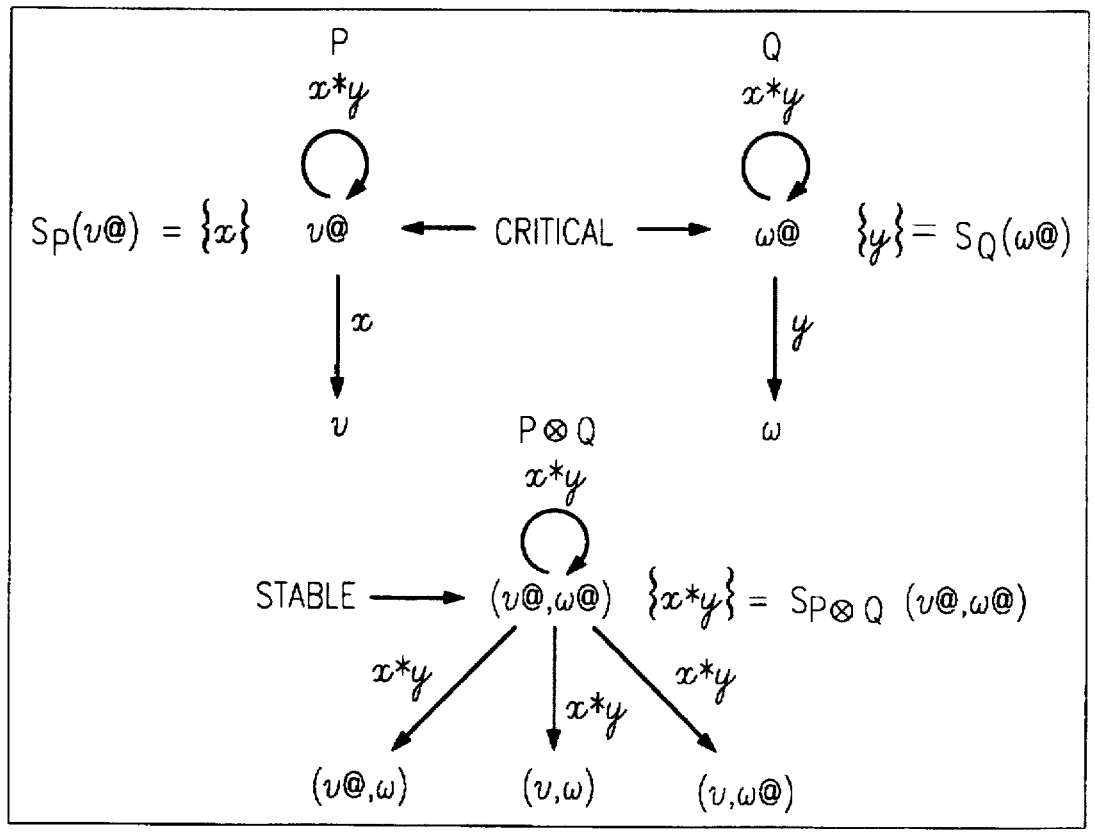
FIG. 7.5

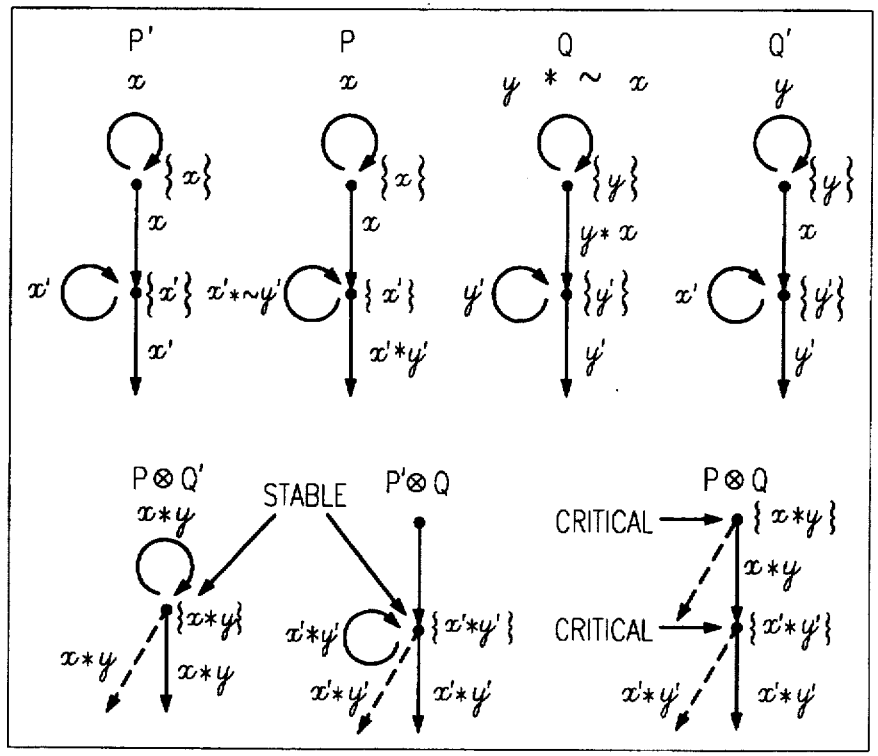
FIG. 7.6
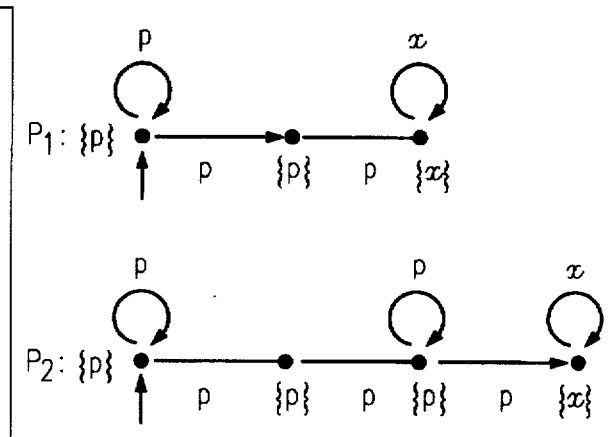
7.6.22 EXAMPLE $P_1$ AND $P_2$ ARE ASYNCHRONOUSLY EQUIVALENT, AS $\mathcal{L}(P_1)$ AND $\mathcal{L}(P_2)$ DIFFER ONLY BY ELEMENTS WHICH DIFFER IN THE NUMBER OF REPETITIONS OF CONSECUTIVE SELECTIONS.
FIG. 7.6A
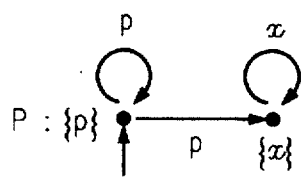
FIG. 7.6B

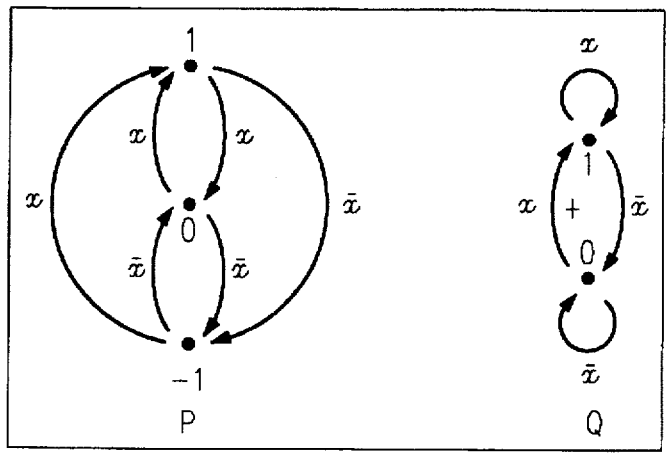
FIG. 8.1
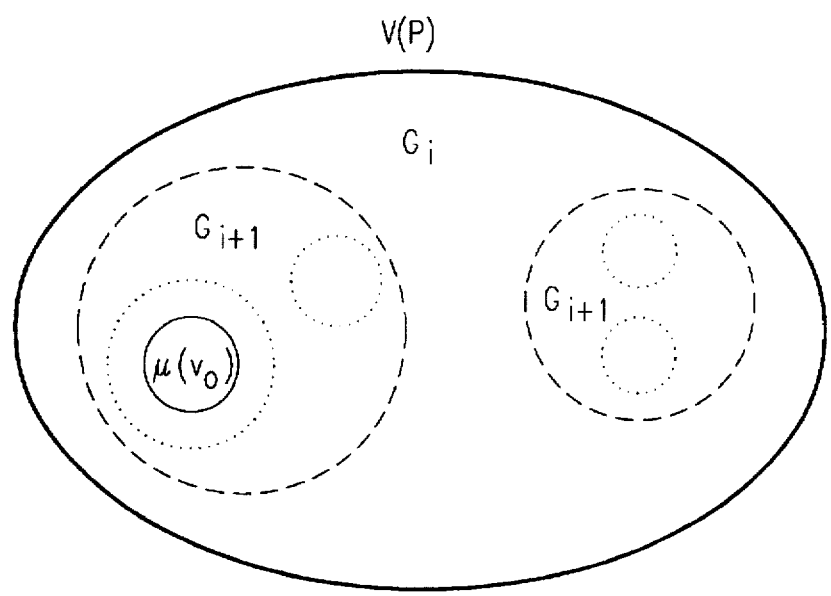
FIG. 8.2
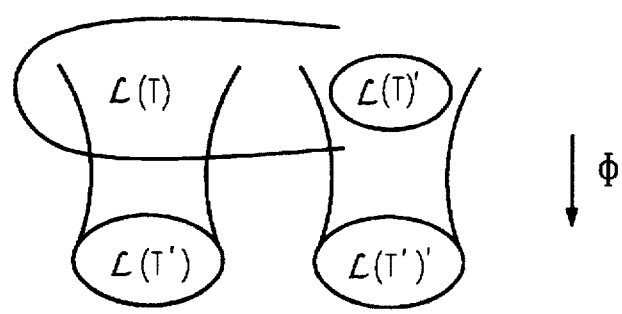
FIG. 8.2A

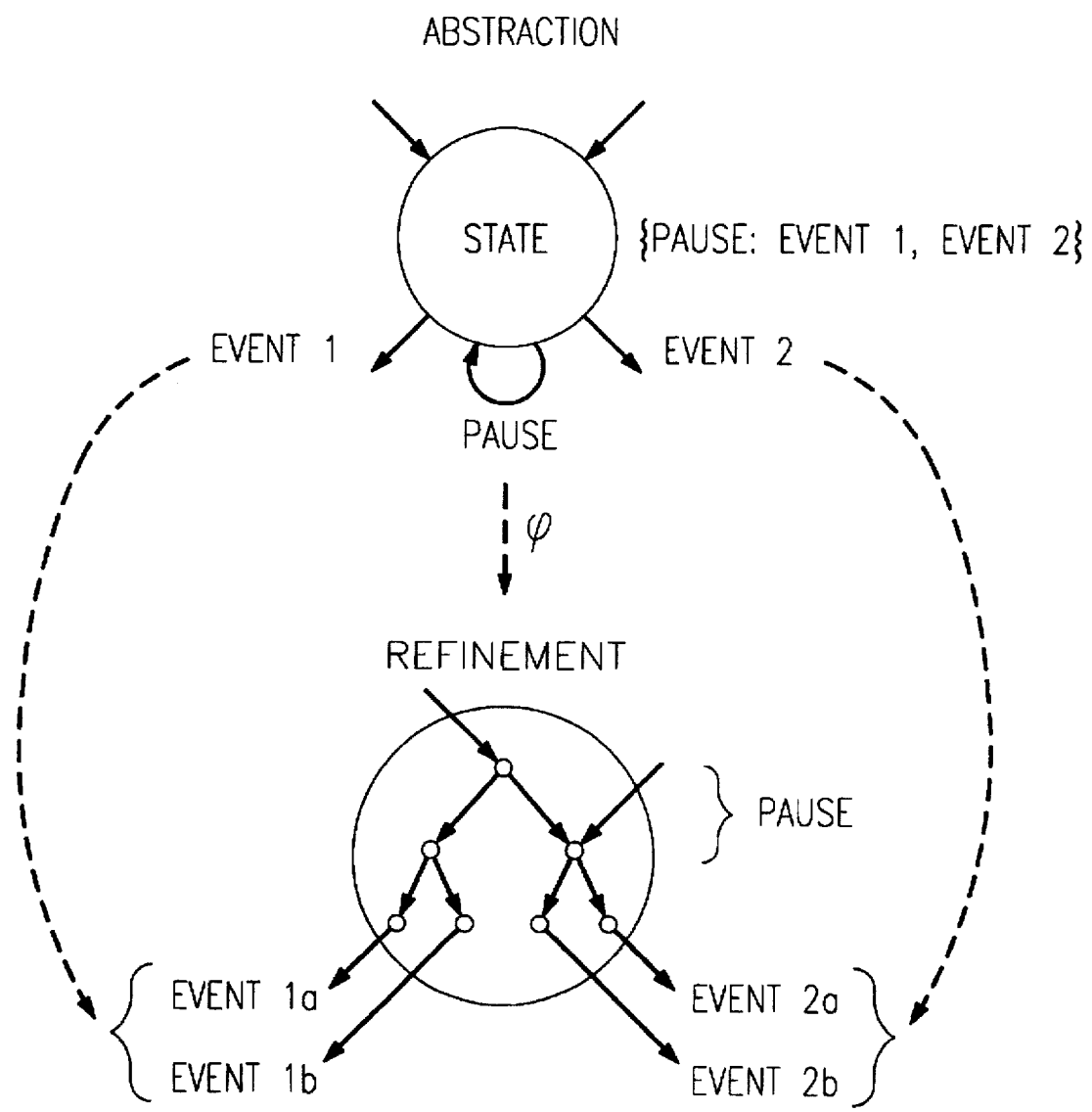
FIG. 8.3

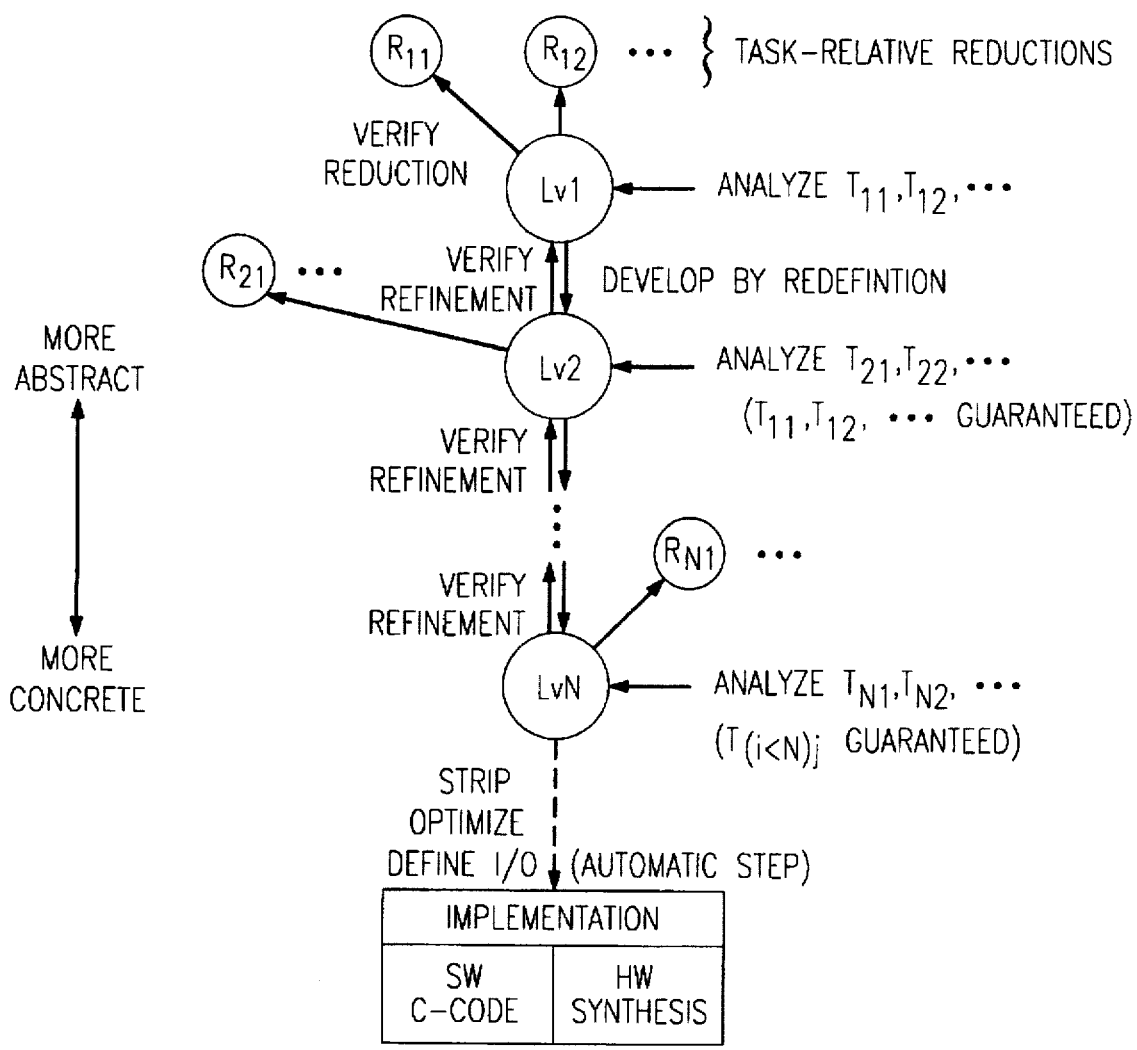
*FIG. 8.4*
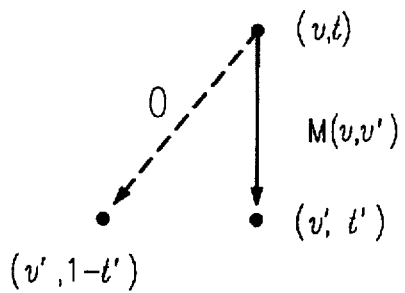
*FIG. 8.4A*

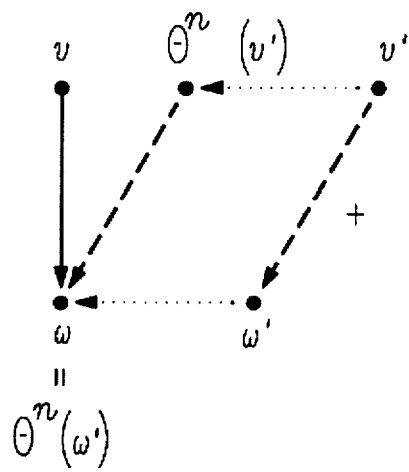
FIG. 8.5
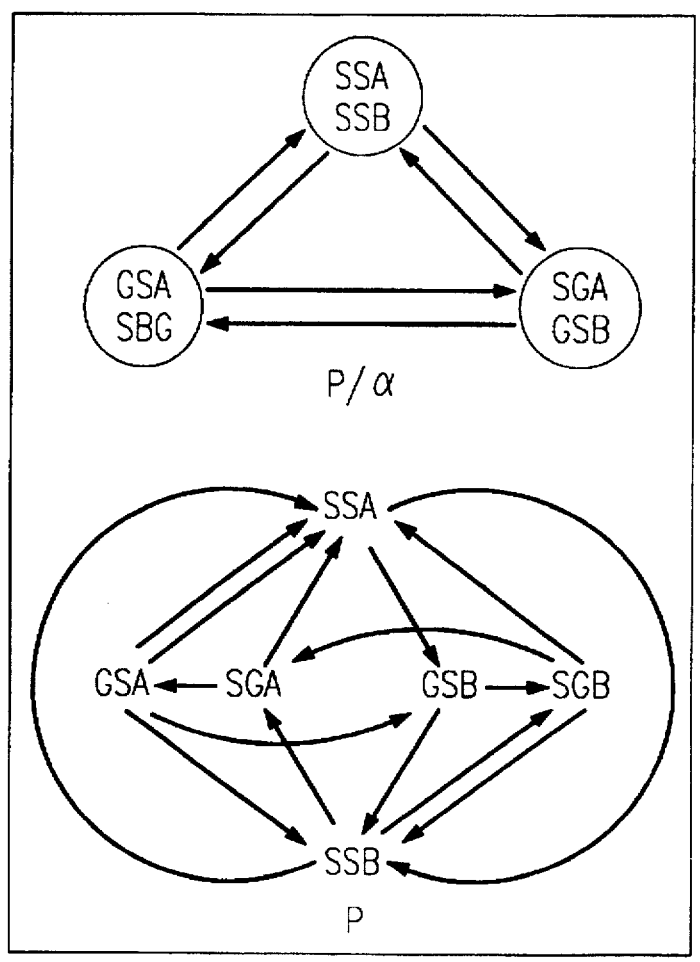
FIG. 8.6

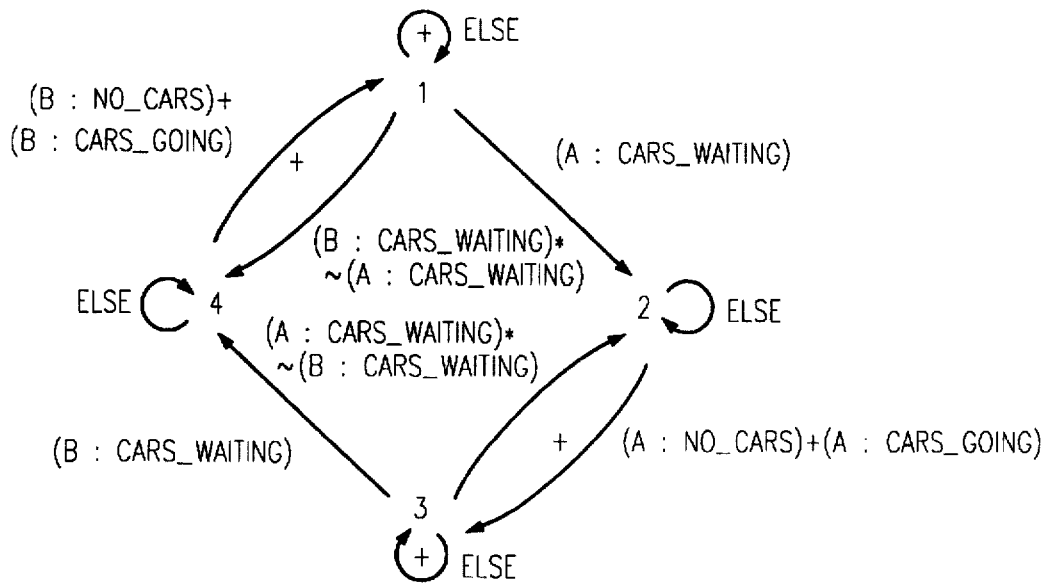
FIG. 8.6A
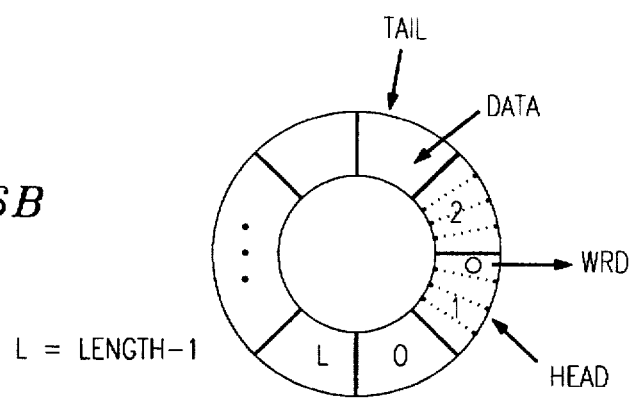
FIG. 8.6B

DERIVING TRACTABLE SUB-SYSTEM FOR MODEL OF LARGER SYSTEM

This is a continuation-in-part of "Timing Verification by Successive Approximation," in which the inventors are Alur, Kurshan, and Yannakakis, and which was filed on Jun. 29, 1992, and which was assigned Ser. No. 07/906,082 (now U.S. Pat. No. 5,483,470). This application is hereby incorporated by reference.

The invention relates to deriving a simple model from a complex model of a system. The simple model is a proper subset of the more complex model, in the sense that, when the simple model succeeds in achieving a defined task; the success implies that the more complex model will also achieve the task.

BACKGROUND OF THE INVENTION

The designer of a complex system generally wishes to verify that the system will perform as expected, prior to actually constructing the system. The designer commonly generates a model of the system, in order to simulate operation of the system.

Frequently, the model takes the form of a complex state machine. However, a complex state machine can reside in an astronomical number of states, and it is generally unfeasible to examine all states, in the testing process.

Example of Large Number of States

An illustration of a large number of states can be found in random access memory, RAM (which is not necessarily a state machine, but which illustrates the magnitude of the problem). Consider a RAM which contains one million bytes, giving a total of eight million bits of storage capacity. The number of possible different combinations of stored bits is $2^{8,000,000}$, which is an utterly enormous number. The RAM, or even a model of it, cannot be tested by storing all possible bit combinations.

Luckily, in the case of RAM, all possible combinations need not necessarily be used. It may be sufficient to write a specific word into every memory location (instead of every possible combination of words), and then read each word, to verify that the words have been stored properly. This process involves one million write operations, plus one million read operations, together with the analysis of each read operation.

This simpler test can be done in a reasonable length of time. However, success of this test does not necessarily guarantee perfect functioning of the system. For example, it is possible (but unlikely) that use of a different word will produce errors. This fact will not be detected by use of the original word. As another example, it is possible that storing two different words at adjacent locations may cause an error, and this fact would also not be detected by the original word.

Large State Machines

State machines also possess large numbers of possible states, and it is not feasible, or even possible, in many cases, to cycle the state machine through all states. Simplifications are done, as by (a) defining tasks which are to be attained, (b) selecting a sub-system of the system, and (c) examining whether the sub-system attains the task. One prior-art approach to simplification, or reduction, is the following. (See F. Balarin and A. Sangiovanni-Vincentelli, "An Iterative Approach to Language Containment," *Lecture Notes in Computer Science (LNCS)*, 697, pages 29–40 [1993].)

Example of Simplification

A user begins with a simpler model, and inquires whether the simpler model accomplishes the task. If not, then the user randomly adds one or more components to the model, and repeats the inquiry. At some point, after a sufficient number of components have been added, the simpler model will probably achieve the task.

However, this approach suffers two disadvantages. One lies in the random approach to expansion of the simple model. There is no assurance that addition of a randomly selected component will increase the likelihood of achievement of the task. Thus, time will probably be wasted in testing non-relevant subsystems, en route to a successful sub-system.

A second is that, the final sub-system probably contains non-relevant components, because of the random addition process. Thus, the model, while perhaps smaller than the larger model which it intended to replace, is nevertheless probably larger than necessary.

SUMMARY OF THE INVENTION

In one form of the invention, a model of a system is reduced to a simpler model by the steps of a) defining a task;

b) defining a subsystem; and c) successively expanding the sub-system, based on functional relationships between the subsystem and components not included in the sub-system, until the task is achieved.

BRIEF DESCRIPTION OF THE DRAWINGS

FIG. 1.1 illustrates ascending level of complexity in different model checking processes.

FIG. 1.2 illustrates a data-flow diagram for a hypothetical traffic signal.

FIG. 1.3 illustrates state transition diagrams for the data-flow diagram of FIG. 1.2

FIG. 1.4 illustrates an omega-automaton which defines the task "no cars collide."

FIG. 1.5 illustrates an automaton which models the requirement that all cars on Avenue A eventually succeed in crossing the intersection.

FIG. 1.5A illustrates a reduced state model.

FIG. 1.5B illustrates reduced state space of a component.

FIG. 1.5C illustrates application of state minimization to the model of FIG. 1.5B.

FIG. 1.5D illustrates an error track.

FIG. 1.5E illustrates two automata.

FIG. 2.1 illustrates classical dynamic representation of an automaton transition structure.

FIG. 2.1A illustrates conditions for transitions.

FIG. 2.2 is a static representation of an automata transition structure, in terms of Boolean predicates.

FIG. 2.3 illustrates parallel composition of the transition structures M and M'.

FIG. 2.4 is a matrix representation of a transition structure.

FIG. 2.5 illustrates that a Boolean algebra may be represented as an N-cube.

FIG. 4.1A illustrates abstraction of detailed events.

FIG. 5.1 illustrates a shift register.

FIG. 5.2 illustrates a deterministic binary counter.

FIG. 5.3 illustrates change of language accepted by an input.

FIG. 6.1A illustrates a state diagram for use with Example 6.1.9

FIG. 6.1B illustrates a state diagram for use with Example 6.2.47.

FIG. 6.1C illustrates a process involved in a proof of Theorem 6.2.49.

FIG. 6.1D illustrates paths in state space along recur edges.

FIG. 7.1 illustrates an s/r model.

FIG. 7.2 illustrates the concept of delay.

FIG. 7.3 illustrates a canonical pair of states.

FIG. 7.4 illustrates a two-level signal alternating between $x_0$ and $x_1$.

FIGS. 7.5 and 7.6 illustrate lockup-free Moore processes.

FIGS. 7.6A and 7.6B illustrate asynchronous equivalence.

FIG. 8.1 illustrate two processes.

FIG. 8.2 illustrates graphically the situation described in Theorem 8.3.16.

FIG. 8.2A illustrates relationships between different languages.

FIGS. 8.3 and 8.4 illustrate a development methodology for use with the invention.

FIG. 8.4A illustrates setting of a bit each time a recur edge is crossed, and unsetting each time a non-recur edge is crossed.

FIG. 8.5 illustrates graphically a situation involved in the proof of Theorem 8.10.6.

FIG. 8.6 illustrates reduction of a graph.

FIG. 8.6A defines the task "All cars on each road eventually get through the intersection."

FIG. 8.6B illustrates reduction of a circular queue.

DETAILED DESCRIPTION OF THE INVENTION

Figure 9:
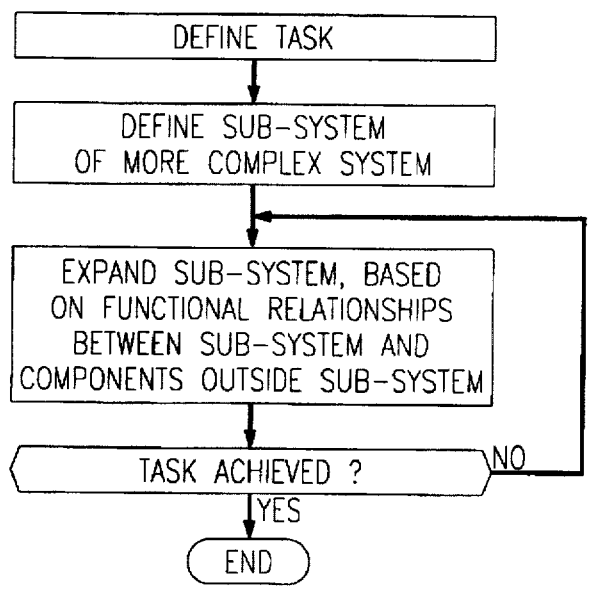
FIGS. 9–11 contain flow charts which illustrate logic implemented by one form of the invention.
Figure 10:
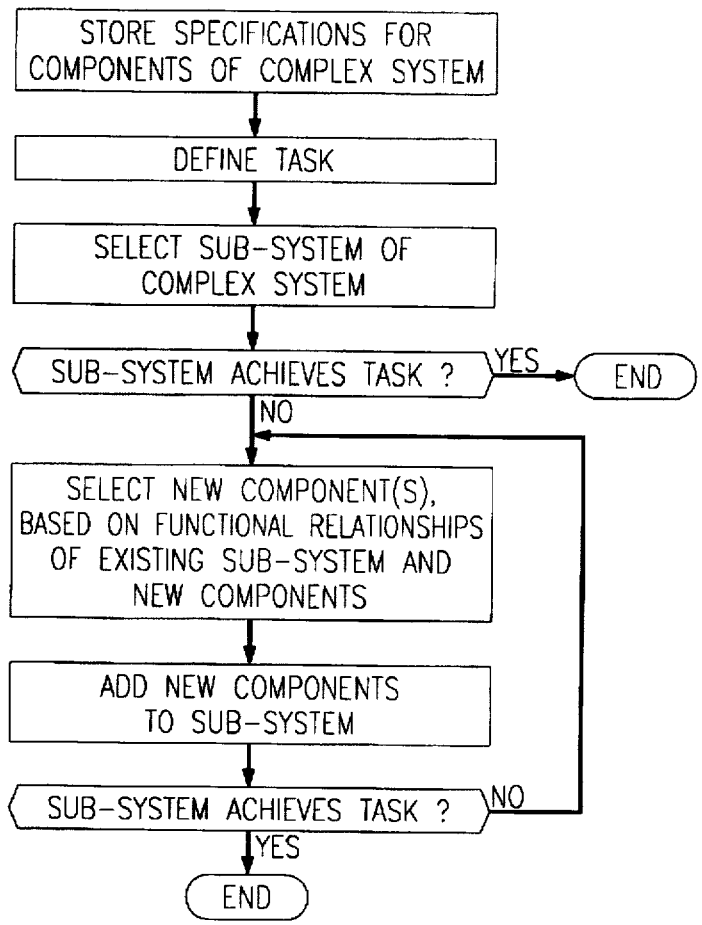
Figure 11:
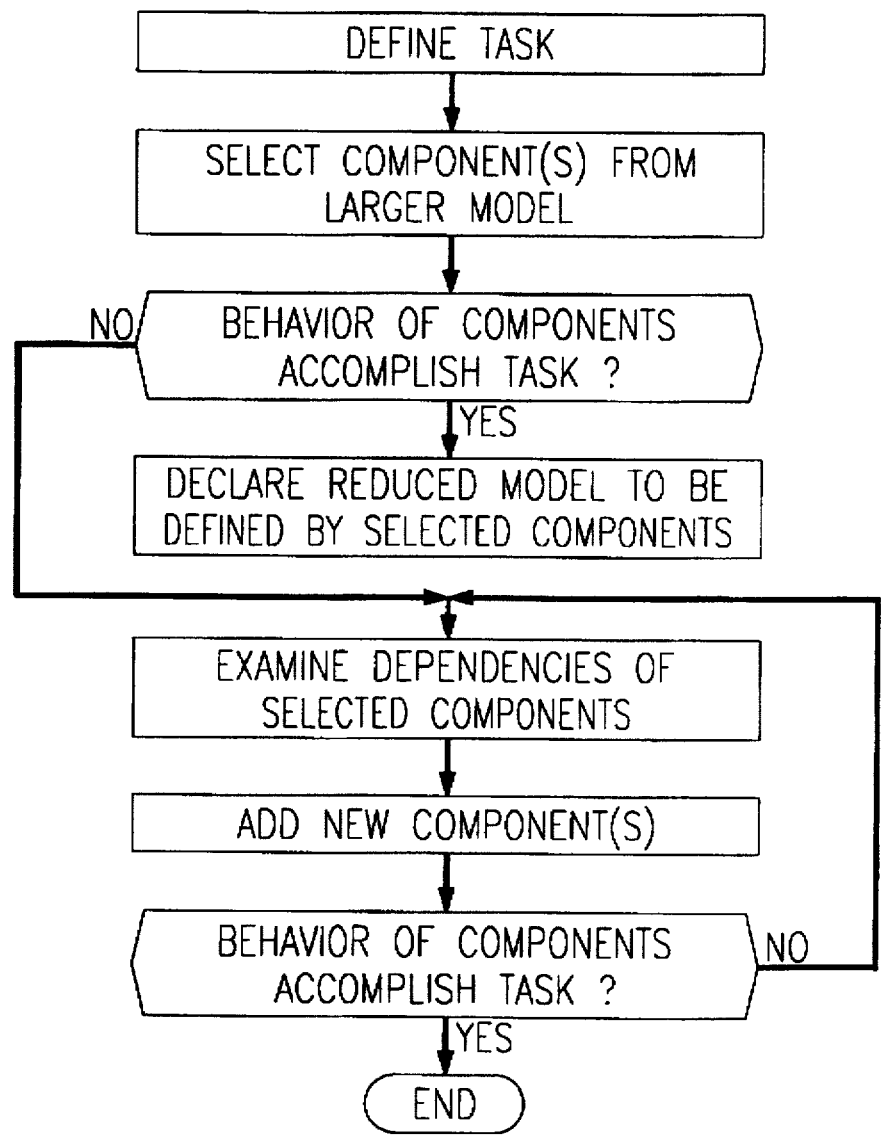

Appendices A (incorporated by reference) and B (attached hereto) contain technical information sufficient to explain how to implement the invention using a programmable digital computer. A highly simplified view of one form of the invention can be given as follows.

Assume that the overall system is an automobile. However, suppose that the task of interest is reception of radio broadcasts. To examine whether the automobile achieves the task, the radio sub-system is to be isolated from the overall automobile.

To a knowledgeable engineer, this particular isolation is straightforward: the radio subsystem contains a list of elements such as the following:

1. power supply (ie, the car battery),
2. power cables,
3. antenna,
4. antenna cable, and
5. the radio itself.

When these are all connected properly, the radio will function.

In the general case, however, such a list is not available, because a minimal set of components (such as the five components listed above) required to perform the defined task is not known. The sub-system must be derived, or abstracted, from the larger system. The invention assists this derivation. One simplified view of the procedure taken by the invention is the following.

Simplified Procedure

Each component, such as the five given in the list above, is described by a model, or specification of operational characteristics. The models may be more, or less, complex, depending on the intentions of the designer. The models describe the relevant behavior of their respective components, generally in terms of input-output relations. As examples, models for the five components given would contain information such as the following.

1. Power supply. Inputs: none. Output: 13.5 volts. Maximum current, 100 amps.

The power supply model may be more complex. It may contain a function which describes output current vs. output voltage. It may also contain input requirements, such as (a) specific temperatures needed, (b) a specified amount of electrolyte needed, having a stated specific gravity or stated chemical composition, and so on. Again, the degree of complexity of each specification will depend on the circumstances.

2. Power cables. Input: power supply. Output: voltage of power supply, minus I-squared-R losses due to current drawn.

3. Antenna. Input requirements: access to ambient rf radiation. Output: rf signal.

4. Antenna cable. Input: antenna output. Output: rf signal, minus attenuation. More complicated specifications will add noise to the output.

5. Radio. Input: antenna cable and power cables. Output: sound of selected channel.

The invention begins by selecting a component known to be involved in the sub-system to be developed, such as the radio itself, item number 5. The invention attempts to cause the radio to operate, by attempting to simulate the radio. However, the radio fails to operate, because, as the radio's specification indicate, power cables and antenna cables are required to provide inputs.

Next, the invention adds these cables to the model, tries to get the radio to operate, but fails again. The invention then examines the specification of the added components. For the antenna cable, the invention finds that antenna output is required as an input. Similarly, for the power cables, the invention learns that the battery is required as an input. The invention adds the battery and the antenna to the model.

Now, the invention tries to operate the radio, and succeeds. A reduced model of has been attained. Chapter 8.4 of Appendix A, incorporated by reference entitled "Automatic Localization Reduction," contains greater detail on the process of reduction, and provides a basis for writing computer code to implement the reduction process. Appendix B, entitled "Task Manager/Reduction Assistant," is a specification which can also be used as a basis for code development.

Significant Features

1. Derivation of the sub-system is not random, but systematic. For example, when the radio in isolation was found inoperative, the invention sought dependencies, and added the components upon which the radio depended, such as the cables described above.

When the radio still failed, the invention sought further dependencies, namely, those of the added components (the cables), and so on. The invention did not add clearly irrelevant components, such as a spare tire, because the component specifications do not express a dependency upon a spare tire.

An extremely simple example of dependency is the following: assume that the output Y of a component Y is described by the following expression, which would be contained in the specification for Y:

$Y = MX + B$

Y clearly depends upon M, X, and B. Assume that M and B are constants, and that the functional specification of Y contains the values for M and B, but not for X, because X is the output of another component, and is variable.

When the invention attempts to operate Y in isolation, failure will result, because no value of X has been used as input. Upon failure, the invention will examine the specification of Y, learn that X is missing, and add a component which supplies X. The invention ascertained the dependence on X, and added X to the sub-system. This example illustrates one view of a systematic approach to expanding the model, or sub-system.

2. Dependency will, of course, depend on the particular details of the specifications used. For example, returning to the automobile example, a particular radio's specification may require exactly 12.0 volts: the radio depends on 12.0 volts. An automobile battery may supply a higher voltage, such as 13.5 volts. A voltage regulator may be required to reduce the 13.5 volts to 12.0 volts.

In this case, the radio has a dependency upon the voltage regulator, which, in turn, depends on the battery. In developing the sub-system, the invention would (eventually) include the voltage regulator, based on the dependencies.

In contrast, a battery which lacks the 12.0-volt requirement will not possess this dependency, and would require no voltage regulator.

Dependency is one type of functional relation existing between components.

Conclusion

The textbook entitled "Computer-Aided Verification of Coordinating Processes." (Kurshan, R. P.; Princeton University Press 1994) is incorporated by reference. Appendix B is a specification which can be used by a programmer to develop code for performing the reduction of a system model. Appendix B is hereby incorporated by attachment.

U.S. Pat. No. 5,163,016, issued to Har'El et al. on Nov. 10, 1992, describes a development apparatus suitable for use with the present invention. This patent is hereby incorporated by reference.

Numerous substitutions and modifications can be undertaken without departing from the true spirit and scope of the invention. What is desired to be secured by Letters Patent is the invention as defined in the following claims.

---

Appendix B
TASK MANAGER/REDUCTION ASSISTANT

---

The Task Manager keeps track of the status of tasks, including which ones need to be re-verified on account of changes in the model.
The Reduction Assistant implements an "automated reduction" algorithm, based upon successive approximations. Given a system specification S and a task T, the objective is to test the language containment $L(S) < L(T)$, given that S is too large to compute explicitly, either in terms of a reached state table or a bdd. Two models are defined for this purpose: an optimistic (small) model M_o and a pessimistic (large) model M_p, with $L(S) < L(M\_p) < L(M\_o)$. Cospan will first test $L(M\_o) < L(T)$. If that succeeds, then $L(S) < L(T)$: "Task performed". Else, the Reduction Assistant will take the error track E from the run M_oxT and test $L(E) < L(M\_p)$, ie test if E extends to M_p. If yes, E is a "real" error and it is reported: "Task failed". (It may happen that $L(E) < L(M\_p)$ is true, whereas $L(E) < L(S)$ is false-- in that case, the user will need to redefine M_p in order to falsify $L(E) < L(M\_p)$, the idea being that testing $L(E) < L(S)$ in cospan is infeasible.) If no, then E is only an artifact of the (overly) optimistic model M_o. In this case, a bigger (less optimistic) M_o is generated, for which $L(E) < L(M\_o)$ is false. This procedure is iterated until either $L(S) < L(T)$ is verified, falsified by a real error track, or the test runs out of memory. (With unlimited memory, one of the first two will occur in a finite number of steps.)
Both the Manager and the Assistant will have an X-window user interface. However, the underlying algorithms will be implemented by runs of cospan. All information will be passed through the interface to ascii files; these files will be read by cospan. This creates a clean interface between the X-window platform and cospan: the X-window routines need know nothing of cospan, and cospan need know nothing of the X-window routines. (They each know only the interface file formats.)
The algorithms on the cospan-side consist of 3 principal routines:
    *Reduction
    *Feasibility Test
    *Make Task
The Reduction routine takes lists of variables and proc's as input, and runs the model specified in the given *.sr file, reduced according to the input lists. This is the routine which creates the M_o and M_p models.
The Feasibility Test performs the $L(E) < L(M\_p)$ test and, if the test fails, generates a new list to define a new M_o.
The Make Task routine uses SCCS to check if a task needs to be re-run on account of a change in the model.
The Reduction and Feasibility Test routines both run off an ascii file of type "Reduction File"; the Make Task routine runs off an ascii file of type "Tasks Status File".
REDUCTION The models M_o and M_p will be defined by respective pairs of "path lists" of variable-path-name prefixes (ie, lists of proc's and var's), each list referring to the basic *.sr model. A pair of path lists is of the form
    p1 p2 ... pn ; q1 ... qm -continued

Appendix B
TASK MANAGER/REDUCTION ASSISTANT

The list p1 p2 ... pn is the "root list"; the *list q1 ... qm is the "free list".
Two such lists together will define a reduced model. Loosely speaking, all
variables defined by the free list are freed in the reduced model, and all
variables which the "root" variables don't care about are "pruned" away.
A path name on each list may be "complete": naming a variable, or it may be a
prefix of a variable, naming a proc. The "completion" of a path prefix (ie,
proc) p, is the set of all variables for which p is a prefix (eg, p.#, p.a.$).
The completion of a path list is the completion of its entries.
(We must consider state variables in the free list, as they may be imported
by monitors in the root list.)
Often, we will refer to the "free list" or the "root list" when in fact
we mean their respective completions, but [hopefully] only when this will
create no ambiguity.
Define the variable dependency graph on the set of all variables of
the original *.sr model: for variables x, y, there is a directed edge
x->y if y is dependent upon x. The dependency sub-graph relative to a free list
is formed from the dependency graph by removing every edge which enters a node
in the completion of the free list which is not of type 'integer'.
Say a variable is "connected" to the root list if there is a directed path from
it to a variable in the completion of the root list, in the dependency
sub-graph relative to the free list.
The "pruning" step:
In forming the reduced model, we:
* free all variables in the free list except those of type 'integer', and
* remove all variables which neither are in the completion of the root list
nor are connected to the root list.
The next step is "variable-resizing":
after the freeing/pruning step, for each variable x, check if (aside from
a possibe free assignment of x or import declaration):
    i) every appearence of x is of the form:
        x=constant
    or
        x-=constant
    or
        (x: constant_list)
    and
    ii) if x is the unique selvar of a proc A, then every appearence of
      'A:' is of the form:
        (A: constant_list)
    and
    iii) the union of the constant's and constant_list's of i) and ii)
        omits at least 2 elements in the range of x;
[so, this excludes '->x', 'x<5' and 'x+1=5', for example]
if i-iii hold, and % is the 1st value in the range of x omitted under iii),
redefine the range of x to be the union of iii) and the value %: say, new_range.
If x is freed, then its free assignment is relative to 'new_range'. Otherwise,
x is not freed; in this case, suppose F is the (logical) expression to which x
is assigned (ie, the assignment of x is equivalent to x:=F or x ->F);
then redefine the assignment of x as:
    x:= F ? (F: new_range) | %
(or x-> F ? .., accordingly). This re-definition of the assignment
of x is important on account of the reducing step, described next. [It also
may be worthwhile in case of a bdd run, when the size of x is reduced by at
least 1 bit.]
The "reducing" step:
this is state space reduction, which will be implemented by the cospan 'reduce'
code. A "reduce list" is created after the resizing step, consisting of each
process containing an unfreed variable which has been resized.
Cospan will run on such a "reduce list", the same as if the key word 'reduce'
had been inserted before each proc on the list. The user will probably want to
intervene in this step, as 'reduce' is a computation-intensive step, and
each application may or may not be worth the trouble. Furthermore, the "reduce
list" may contain nested proc's; the user will have to decide whether to do
    reduce A.A; reduce A.B
or merely
    reduce A
Therefore, this Reduction algorithm will create a "proposed reduce list":
    ?R: A(3) (A.A(6) A.B(4) (A.B.A(9) A.B.B(3))) B (6)
listing all processes containing a top-level resized unfreed variable,
which the user edits to form the actual "reduce list":
    ?R: A.A A.B.A B
Each number in '( )' is the product of the numbers of excluded values for each
resized variable at the given level.
REDUCTION FILE FORMAT A new run-time option, -R, is introduced to cospan; 'cospan -R ..' takes 2
*.sr files (with the semantics that the 2nd is concatenated to the end of the

Appendix B
TASK MANAGER/REDUCTION ASSISTANT first). The first gives the system model S, while the second gives the "task" T. The physical separation of S and T is important for several of the routines. One "reduction file" is associated with each respective task. The format is as follows:

!M_p: tab-separated path-list ; tab-separated path-list
--------

!Vars tab-separated variable list
!Vars_c tab-separated variable list
!Vars_r tab-separated variable list
!Vars_f tab-separated variable list
!M_o: tab-separated path-list
!S: status (see below; placement not unique)
!OP: 'cospan -R ..' additional run-time options
?R: proposed reduce list
!R: reduce list
!VS: SCCS version number of <system_name>.sr-- the "system" model S
!VT: creation date of task.sr-- the *.sr file containing the task T
date
stderr from cospan run
!S: status Call the 1st line the "pessimistic list"; call the succeeding lines an "optimistic sub-table". The reduction file may consist of a pessimistic list, followed by any number of optimistic sub-tables, the last such being the "active" optimistic sub-table. The "optimistic list" is the list
    1_11 ; 1_12 1_2
formed from the pessimistic list
    !M_P: 1_11 ; 1_12
and the line
    !M_o: 1_2
calculated from the 4 '!Vars' lines of the active optimistic sub-table.
Thus, the root list is defined both for the optimistic and pessimistic models in the first path list of the !M_p line; the free list of the optimistic model is the union of the free list of the !M_P line and the !M_o line.

REDUCTION (CONT.)

The Reduction routine will be run as follows. The user interface executes:
    cospan -R<reduction_file> <!OP options> system.sr -DtoK task.sr
All cospan run-time options are taken from the '!OP:' directive in the active sub-table ONLY. There are 3 cases of this execution:

Case 1:
The active optimistic sub-table contains neither an '?R:'" directive,
nor an '!R:' directive. In this case, if there is no !M_o list, cospan computes
it according to the algorithm described below, and stops;
otherwise, the !M_o, !S and !OP lists exist, in which case cospan computes
the "optimistic list" (from M_p&M_o) and generates the parse tree which results
from performing the freeing, pruning and resizing steps on the model (system.sr&task.sr)
NB: As a locvar or even a stvar may be on the free list, we need to support
freeing of these variable types. [However, 'free proc p' still will free
only the top-level selvar's of p.]
If a non-empty "proposed reduce list" is computed, it is
appended to 'reduction_file' as a '?R:' directive, and the routine stops.
Otherwise, C-code/bdd generation followed by analysis proceeds as always.

Case 2:
If the active sub-table contains an '!R:' directive, then 'reduce' tokens are
inserted into the parse tree as directed by the active '!R:' directive, and the
run continues as always from that parse tree. (In the case of one or more reduce
tokens, one run of cospan is required for each token to do the reduction, plus
a final run to do the analysis on the reduced model. This iteration probably
should be automated here. However, in developing the Reduction routine,
the '!R:' directive probably should be ignored for now.)

Case 3:
If there is a '?R:' but no '!R:', the run returns an error.
The date/version-numbers/stderr from the cospan run are appended to the
'reduction_file' (the stderr continues to come out as stderr, as well)
A new "status" field '!S:' is appended by cospan, according to the following:
    check iteration N - N=1 entered by 'maketask'; N>1 by Feasibility routine
    ready iteration N - entered by Feasibility (or user, from 'check')
    redo - equivalent to 'ready iteration 1'; 'maketask' "stale" indication
    running iteration N - set from 'ready iteration N' (or 'redo' with N=1)
    feasibility check N - set from previous status upon "Task failed"
    Task performed - set from 'running iteration N' upon "Task performed"
    user-terminated iteration N - set from 'running iteration N' by "kill"
    out-of-memory iteration N (step) - set from 'running/feas .. N'
        step = Compilation or Verification or Feasibility check
    error - set by Feasibility routine to indicate a valid error track *.T -continued

Appendix B
TASK MANAGER/REDUCTION ASSISTANT

FEASIBILITY TEST

This routine tests $L(E) < L(M\_p)$ for a *.T file E and the model generated
from the pessimistic list, invoked by:
    cospan -z -R<reduction_file> <!OP options> system.sr -DtoK task.sr
    cospan -z0 -R<reduction_file> <!OP options> system.sr -DtoK task.sr
Assumes existence of error track E: 'system.T' in current directory.
Option -z0 means "don't iterate' (see below)
Generates parse tree from pessimistic list, by pruning and resizing variables,
as with the Reduction routine (but without the reduce step). Normal cospan
run of system.sr (S) together with task.sr (T) (ie, SxT), except
SxT is run together with E, which is treated as a process with state
transitions enabled by 'true' from its i-th (vector) state to its (i+1)-st
(vector) state, for all i up to the length of E in the case of a "finite" E,
or including the additional back-edge, in the case of a "Bad cycle" E.
During the run, which is a cross between a
Mealy model (-m) run and a sthom run, we check that each "next-state" of SxT
matches the corresponding next-state of E (ie, consider the state components
of E in SxT: their respective values in E are checked for a match with those
in SxT for each next-state of SxT and the (unique) next-state of E). If there
is no match, truncate that transition. A state of SxTxE with *every* exiting
transition thus truncated is called a "lock-up". For each lock-up state V,
for each selection valid at V, let v be the 1st state component of E which
fails to have its next-state value match the next-state value of v in E,
say $v=v\_{i+1}$. If $v=v\_i$ is the current-state value of v (ie, value of v in V),
look at the variables which enable the transition $v\_i -> v\_{i+1}$. Call these
Vars(V). (We should compute Vars(V) during the crank, setting Vars(V)=0 at the
end of crank, if it turns out that V is not a lock-up.) [Note that Vars(V)
will consist only of variables of M_o (free or otherwise).]
Here's how to compute Vars(V):
For each selection (in SxT) at V, as we crank out the stvar's of SxT (case RESOLVE),
for each stvar v which is a component of E, check if the next-state (or, one of
the next-states, in case of a 'n' run) matches the required next-state value
in E. If yes, continue; if not, stop case RESOLVE for that selection, and add to
Vars(V) some variables which collectively disable the transition from the
current value of v to the required next value of v. If this particular set of
variables is too hard to compute, get as close as practical (too many variables
is ok; too few is not allowed); for example, all variables upon which v is
dependent gives a list, when a finer list is impractical. Add these variables
to Vars (V), and pick the next selvar (valid at V) to crank. Continue like this
until all selvars are cranked. If for any selection, the required next-state
match occurs, set Vars(V)=0, and set a flag to ensure that it stays =0 for the
rest of the selvar cranks (but, continue to crank all selections from V, as
there may be other states with next-state matches: we want them all).
There are 3 possible conclusions to the run of SxTxE:
Case 1:
If E is a "finite" error track ("No transition", "Lockup", etc), we reach
the last state of E in SxTxE, and reproduce the same error, or another
error which results in the same finite error track, or an infinite error
track consisting of a "Bad cycle" self-loop at the final state of E;
or, E is an "infinite" error track ("Bad cycle"), and we reach the end of
E, and then can continue to cycle in the Post mortem cycle of E, eventually
reaching the same state of SxTxE twice AND cospan reports the result in
SxTxE as a "Bad cycle", (ie, not excepted by a cyset/recur in SxT).
In either. case, the result is a real error.
We report "Task failed", set the '!S:' status field to "error" and over-write
the old *.T file with the new error track (of SxT). [The old track will be
a projection of the new track to the variables of E, after possibly
concatinating to E 0 or more copies of its Post mortem cycle.] We dont care
about any of the Vars* sets, as the algorithm terminates with the finding of
this real error. Thus, as soon as this case applies (if at all), we stop.
Case 2:
The conditions defining Case 1 fail, meaning that E is an artifact of the
optimistic model M_o. This situation can arise for several reasons,
which we separate into Case 2 and Case 3. One reason Case 1 may fail is that
we fail to reach the end of the E track (for all possible init matches of E
in S, and all possible selections along the path of E).
In this case, let Vars = †/Vars(V) (union over all lock-ups V) and let Vars_f
be the elements of Vars which are in the active !M_o (free-) list.
[Note: there is a possibility that Vars_f is empty.]
Set Vars_c=Vars_r=0.
Case 3:
Suppose Cases 1 and 2 don't apply.
In case E itself is "infinite" (ie, a "Bad cycle" track) and we reach the
last state of E, with one or more additional transitions through the
'Post mortem' loop of E, arriving finally twice to the same state of SxTxE, but
cospan reports the result in SxTxE as "Task performed", then look at the

Appendix B
TASK MANAGER/REDUCTION ASSISTANT cyset check at the end of the run: each SCC must have been contained in some cyset of SxT. (This applies for each match of init's in S, and each branch in SxTxE which follows E, so there may be several.)
Each such cyset must have involved stvar's which are NOT components of E. Let Vars_c be the set of all these.
Furthermore, let Vars_r be the set of stvar's crossing recurs after the 'Post Mortem' point of E. (These will be stvar's of S not in E. Ideally, we should exclude from Vars_r the cases which arise from a transition whose end-points are both in cyset's; if implementing this is problematic, we can ignore this refinement.) These stvar's arising from recur's are treated the same as the stvar's in Vars_c, defining the set Vars_r.
If we don't ever arrive to the same state twice, for any init's match (although we've reached or passed the end of E), then we are in the same logical condition as Case 2, and we proceed analogously.
In all these possibilities, we define Vars and Vars_f as in Case 2.
Thus, in Case 3, we have Vars_f, Vars_c and Vars_r defined.
(Note that Case 3 includes the possibility that some embeddings of E in SxTxE fall under Case 2; there may be several embeddings of E, defining repective Vars_c and Vars_r; the definitions of all the Vars_* must accumulate over these respective embeddings.)
> !NB: We must never combine states inside a cyset with ones outside, or
> !collapse together states within a cyset (except in the special case that
> !they all are equivalent), although we may remove any cyset altogether; the
> !reason is that a reduction must be conservative by construction, increasing
> !behaviors, whereas collapsing states within a cyset or adding to a cyset
> !additional states is non-conservative, decreasing behaviors. Thus, if any
> !stvar of a high-level cyset is pruned or freed, the entire cyset which
> !contains it must be removed.

Append to the reduction_file a separator '----', followed by the definitions of Vars, Vars_c, Vars_r and Vars_f.
COMPUTING !M_o LINE We need to define a new (more pessimistic) optimistic model M_o.
Definition of "disconnect":
Let x be any variable. A variable d is a "disconnect" of x if every path in the dependency graph from d to x goes through a stvar not equal to d. A disconnect d of x is "minimal" if some path from d to x does not pass through another disconnect of x.
Compute a new !M_o free list L' as follows from the previous !M_o list L and Vars_f, Vars_c, Vars_r:
Case 1:
Vars_f non-empty.
Form L' from L by removing from L each element of Vars_f, and add to L' each disconnect d of an element of Vars_f, unless d is in the root list of !M_p.
[Since the pruning step will remove all non-minimal disconnects, they need not be added to L'.]
Case 2:
Vars_f = 0, Vars_c and/or Vars_r non-empty.
Let Vars_cc be the set of elements Vars_c and Vars_r which are closest (in the dependency graph) to an element of L.
Set Vars_f to be the set of elements v of L for which there is a path in the dependency graph from an element of Vars_cc to v.
Apply case 1.
[This may not bring the elements of Vars_cc into the M_o model, although typically it will.]
Case 3: Case 4:
Vars_f = 0, Vars_c = 0, Vars_r = 0.
If (Case 3:) Vars is non-empty and there is a unique variable in L closest to Vars (in the dependency graph), or (Case 4:) there is more than one variable in L closest to Vars (if Vars = 0, we consider all the variables of L to be closest to Vars). Set Vars_f to be these, and apply Case 1.
In each case, this gives the new '!M_o:' list. In cases 1,2,3 append the status field '!S:' as "ready iteration N+1". In case 4, append the status field '!S:' as "check iteration N+1". This gives the user an opportunity to edit the '!M_o:' list. (Note: as a fail-safe mechanism, we should return an (internal) error and stop, if N > number of variables in M_p model, a logical impossibility.).
Copy the previous !OP line.
In cases 1,2,3, we re-run Reduction on the new "reduction file" (the -z0 option means to stop at this point).
MAKE TASK This program sets up the Reduction files and keeps their status current.
It presumes/maintains the following file system:
The root subdirectory for system 'system' contains the system-model files
   system_i. sr -continued Appendix B
TASK MANAGER/REDUCTION ASSISTANT for each i, where i is an integer defining the abstraction level of the model.
[These should be in the same directory so we can hom:sys_i.sr -> sys_{i-1}.sr]
For each i there is a subdirectory
    ./tasks/Lvi
containing for each task its S/R spec task.sr and its "reduction file"
task.rf, as well as the general "tasks status" file
    ./tasks/Lvi/taskstat
[Later, we will implement the Simulation Manager, which Will run off files
    ./cuts/Lvi/toK
in a very similar fashion, except in this case, the Simulation file (analogous
to the Reduction file) will also allow reduction of non-determinism via
elimination of variable values).]
Additionally, there are the SCCS files:
    ./sccs/s.system_i.sr
Each file has an SCCS Version number of the form M.N; the file is shipped
from central distribution as M.0 and then the sub-index N is incremented
by each user. Periodically, user copies are merged centrally, and reshipped
with incremented M.
The command
    maketask i
does the following:
*does a "make delta" on system_i.sr, updating ./sccs/s.system_i.sr
*creates default Reduction file ./tasks/Lvi/task.rf
where none exists, setting the pessimistic model M_p to "all" (set the root
list to be all variables in the task; empty free list) and the optimistic
model M_o to have the free list consisting of all (minimal) disconnects of
the root list which are not themselves in the root list.
Sets status to 'check iteration 1'. Adds the version number of system_i.sr and
the creation date of .tasks/Lvi/task.sr in the !VS and !VT lines, respectively.
*checks "currency" of each task with outdated version/creation fields, as
follows:
if the creation of the task doesn't match that in the !VT line, the task is
"stale".
Generate the C-code for the optimistic model for current version
number and *.rf version number; 'diff' the two files; if there's a diff,
the old_version is "stale".
Update the version fields; where version check indicates a stale "Task
performed", change status to 'redo'; for other stale cases, change status
to 'check iteration 1'.
*updates 'taskstat' file, which contains, for each task 'task',
the following line, taken from the './tasks/Lvi/task.sr' file:
    task status run_time_options Version(system_i.sr) Version(Lvi/task.sr)

We claim:

1. A process of deriving a model of a sub-system from a model of a more complex system, comprising the following simulation steps:
   a) defining a task;
   b) defining a sub-system; and
   c) successively expanding the sub-system, based on functional relationships between the sub-system and components not included in the sub-system, until the task is achieved.

2. A method of deriving a model of a sub-system from a model of a more complex system, comprising the following steps:
   a) storing specifications for components of the complex system, which describe functional relationships between the respective component and other components;
   b) defining a task;
   c) selecting a subsystem of one or more components;
   d) testing whether the subsystem achieves the task and, if not, successively repeating the following steps until the task is achieved:
      i) selecting one or more new components, based on the functional relationships of
         A) components in the existing subsystem, and
         B) the new components;
      ii) adding the new components to the sub-system, to produce an expanded sub-system; and
      iii) testing whether the expanded sub-system achieves the task.

3. A method of deriving a reduced model from a larger model which contains
   A) specifications which describe behavior of components of the larger model, and
   B) descriptions of functional relationships between components of the larger model,
comprising the following simulation steps:
   a) defining a task;
   b) selecting one or more components and examining their behavior;
      i) if the combined behaviors accomplish the task, declaring that the reduced model is defined by the selected components; and
      ii) if the behavior fails to accomplish the task, examining dependencies of already-selected components, and repeatedly adding components which supply the dependencies, until the task is accomplished.

* * * * *